United States Patent [19]

Krupka

[11] 4,001,719
[45] Jan. 4, 1977

[54] FABRICATION OF A SELF-ALIGNED MIRROR ON A SOLID-STATE LASER FOR CONTROLLING FILAMENTATION

[75] Inventor: Dan Charles Krupka, Summit, N.J.

[73] Assignee: Bell Telephone Laboratories, Incorporated, Murray Hill, N.J.

[22] Filed: Aug. 13, 1975

[21] Appl. No.: 604,089

[52] U.S. Cl. .................. 331/94.5 H; 331/94.5 C; 96/36; 96/38.3; 357/18
[51] Int. Cl.$^2$ ............... H01S 3/02; G03C 5/00
[58] Field of Search .............. 331/94.5 H, 94.5 C; 96/36, 38.3; 357/16–18

[56] References Cited
UNITED STATES PATENTS

| | | | |
|---|---|---|---|
| 3,761,837 | 9/1973 | Leheny | 331/94.5 H |
| 3,849,738 | 11/1974 | Hakki | 331/94.5 H |
| 3,866,238 | 2/1975 | Monroe | 331/94.5 H X |
| 3,932,184 | 1/1976 | Cohen et al. | 96/38.3 |

*Primary Examiner*—Robert J. Webster
*Attorney, Agent, or Firm*—Lucian C. Canepa

[57] ABSTRACT

A very small high-reflectivity mirror surrounded by a low-reflectivity region is fabricated in a self-aligned manner directly on one of the output faces of a stripe-geometry solid-state laser. The phenomenon known as filamentation is thereby effectively controlled.

7 Claims, 7 Drawing Figures

FABRICATION OF A SELF-ALIGNED MIRROR ON A SOLID-STATE LASER FOR CONTROLLING FILAMENTATION

BACKGROUND OF THE INVENTION

This invention relates to solid-state lasers and, more particularly, to a method for constructing such a laser so that it will operate in only its fundamental mode.

Extensive efforts have been directed in recent years at developing stripe-geometry junction lasers (for example, those of the double-heterostructure type). These solid-state devices operate on a continuous-wave basis at room temperature and, in addition, provide the capability of obtaining relatively high pulsed power outputs.

In a variety of applications of practical interest, it is desirable that such a laser be controlled to operate in only its fundamental or zero-order mode. In an optical communication system, the fundamental mode facilitates optical coupling between various components of the system (for example, efficient matching into singlemode fibers for dispersion-free propagation). Furthermore, where high optical power densities are desirable, such as in a laser machining or micrographics system, the fundamental mode is most desirable because it permits the simplest delivery of power from the laser to the image plane of the system.

Multimode operation of a double-heterostructure laser is typically characterized by the presence of plural competing laser spots on the output faces of the device. This phenomenon, often referred to as filamentation, is, as indicated above, generally undesirable.

Various techniques have been suggested for controlling filamentation in double-heterostructure lasers. Some of these require complex fabrication steps for forming a three-dimensional waveguide resonator and, moreover, may not permit the attainment of a laser cavity with a cross section sufficiently large to handle the needed peak power. An example of such a technique is described in "GaAs-Ga$_{1-x}$Al$_x$A$_s$ Buried Heterostructure Injection Lasers" by T. Tsukada, *J. Appl. Phys.*, pages 4899–4906, November 1974.

Another suggested technique for controlling filamentation in a double-heterostructure laser involves the fabrication of a very small mirror on one of the output faces of the laser. This approach requires a practical instrumentality for defining the mirror and for accurately positioning it in line with the major filament or fundamental-mode-output spot of the laser.

SUMMARY OF THE INVENTION

An object of the present invention is a method for facilitating the construction of a solid-state laser that operates in only its fundamental mode.

More specifically, an object of this invention is a method for fabricating a very small mirror in a self-aligned manner on one of the output faces of a double-heterostructure laser to control filamentation.

Briefly, these and other objects of the present invention are realized in a specific illustrative embodiment thereof in which antireflective and positive photoresist layers are deposited in that order on one of the output faces of a double-heterostructure laser. The laser is energized while one end of a single-mode optical fiber is positioned near the one output face of the laser to maximize optical power coupling to the fiber. In this way the one end of the fiber is located over the laser's major filament. Radiation is then introduced into the other end of the fiber to expose that portion of the positive photoresist that is directly in line with the core of the fiber. After removing the exposed photoresist, the remaining photoresist is utilized as a mask for depositing a high-reflectivity film. Subsequent removal of the remaining photoresist from the one face of the laser leaves a very small high-reflectivity region accurately positioned on the antireflective layer.

BRIEF DESCRIPTION OF THE DRAWING

A complete understanding of the present invention and of the above and other objects may be gained from a consideration of the following detailed description presented hereinbelow in connection with the accompanying drawing. In the drawing, FIGS. 1 through 7 schematically depict various stages in the fabrication of a very small mirror on one of the output faces of a solid-state laser in accordance with a specific illustrative method that embodies the principles of this invention.

DETAILED DESCRIPTION

Figure 1:
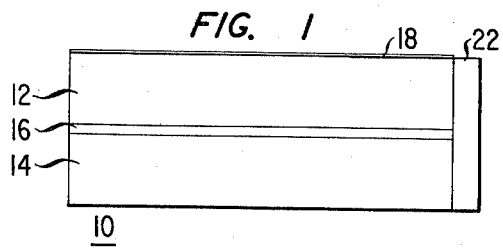

FIG. 1 is a side-view schematic representation of a particular solid-state laser to which the method of the present invention is illustratively applicable. By way of example and for ease of depiction, the unit 10 is assumed to be a gallium arsenide junction laser of the homostructure type, although it is emphasized that the principles of the present invention are equally applicable to solid-state lasers of, for example, the single- and double-heterostructure type. The illustrative laser combines p- and n-type regions 12 and 14, respectively, forming therebetween a planar active region 16 in which radiative recombination of holes and electrons occurs to produce stimulated emission of radiation. As is well known, the width of the active region 16 measured parallel to the junction plane in the x direction is limited by a stripe-geometry contact 18. The contact 18 extends, for example, the entire length of the laser 10 and is typically 10 to 20 microns wide in the x direction.

The lefthand end of the laser 10 of FIG. 1 is, for example, cleaved in a conventional way to provide a reflective surface that defines one end of the resonant cavity that includes the active region 16.

Advantageously, the righthand end of the laser 10 of FIG. 1 is coated with an electrically nonconductive layer 22 that is antireflective at the wavelength at which the laser operates. Illustratively, for a gallium arsenide laser operating at a wavelength of 0.89 microns, the layer 22 comprises a 0.1-micron-thick layer of ZrO$_2$. Or the antireflective layer 22 may, for example, comprise a coating of ZnS (about 500 Angstroms thick) deposited on the righthand end of the layer 10 and a coating of Al$_2$O$_3$ (about 850 Angstroms thick) deposited on the ZnS. Other single- or multi-layer coatings for achieving a suitable antireflective layer are well known in the art.

Figure 2:
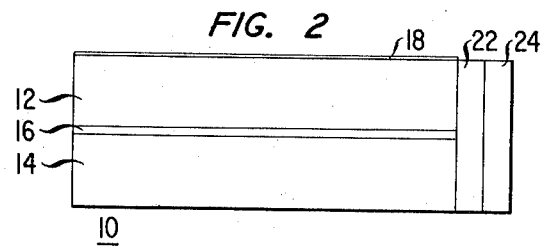

Next, in accordance with the principles of the invention, a layer 24 (FIG. 2) of a positive photoresist is coated on the layer 22. The layer 24 comprises a conventional high-resolution photosensitive polymer. It is characteristic of such a positive photoresist that portions thereof exposed to sensitizing radiation (for example, ultraviolet light) do not remain in place during subsequent standard developing and rinsing operations whereas unexposed portions do so remain.

A variety of positive photoresists suitable for inclusion in the process described here are known in the art. Illustratively, a 1.5-micron thick coating of such a photoresist comprises the layer 24. Standard positive photoresists known in the art and suitable for use in the process described herein are disclosed in chapter 7 of *Handbook of Thin Film Technology*, edited by L. I. Maissel and R. Glang, McGraw Hill, 1970. A specific example of a suitable positive photoresist for use in the process is a conventional cresolformaldehyde resin combined with photodecomposable naphthoquinone diazides and a solvent.

Figure 3:
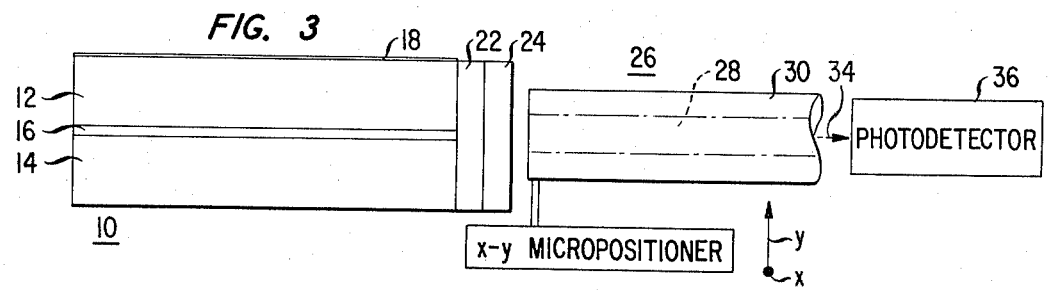

Selective exposure of a particular portion of the positive photoresist layer 24 is carried out in accordance with the principles of the present invention by the technique represented in FIG. 3. As indicated there, one end of an optical fiber 26 is positioned in close proximity to the surface of the photoresist layer 24.

The element 26 is a conventional cladded-core optical fiber of the single-mode type made, for example, of quartz. Illustratively, the fiber 26, which is circular in cross-section, includes a 4-micron-diameter core 28 and a 250-micron-diameter cladding 30. (Noncircular-cross section fibers may, of course, also be used.)

By way of example, the cladding 30 of the fiber 26 shown in FIG. 3 is made of quartz (fused silica), and the core 28 thereof is made of suitably doped fused silica. As is well known, the core of such a fiber exhibits a slightly higher index of refraction than that of the cladding. Accordingly, the core serves as a well-defined transmission path for optical signals coupled thereto. An illustrative fiber of this type, wherein the dopant is a multivalent metal oxide, is described in R. D. Maurer et al., U.S. Pat. No. 3,659,915, issued May 2, 1972. It is emphasized, however, that a variety of the other known and conventional glass materials systems are suitable for forming a fiber to be used in carrying out the method of the present invention. Other such suitable materials are described, for example, in "Low-loss Glass Fibers for Optical Transmission" by A. D. Pearson et al., *Bell Laboratories Record*, April 1972, pp. 103–109.

In accordance with the invention, the lefthand end of the fiber 26 of FIG. 3 is moved in the $x$-$y$ plane by a conventional micropositioner 32 that is mechanically coupled to the fiber. Movement occurs while the laser 10 is activated to provide an output at its characteristic wavelength. In the process of being so moved, the fiber 26 has coupled to the small diameter core thereof optical power from one of the modes of the laser 10. Advantageously, to insure that only the core 28 of the fiber 26 is effective to propagate optical power to the righthand end of the fiber 26, a conventional mode stripping material (for example, glycerol) having a refractive index slightly higher than that of the cladding is coated on the outer surface of the fiber. Such a material causes any optical power coupled to the cladding 30 from the laser 10 to be scattered out of the cladding into the medium surrounding the fiber. (Advantageously, the length of the fiber 26 shown in FIG. 3 is made sufficiently long to insure that a major portion of any optical power coupled to the cladding 30 is effectively stripped from the fiber along its longitudinal extent.) Accordingly, any modes launched into the cladding of the fiber are not transmitted to the righthand end thereof. As a result, the fiber 26 serves as a small-diameter "window" (determined approximately by the size of the core 28) for coupling only a portion of the laser's output power to the righthand end of the fiber.

In accordance with the invention, the lefthand end of the fiber 26 shown in FIG. 3 is moved by the mechanism 32 to maximize the optical power coupled into and transmitted by the core 28 of the fiber 26. The optical power delivered by the core 28 to the righthand end of the fiber 26 is propagated in the direction of arrow 34 to impinge upon a standard photodetector 36. A peak signal reading provided by the detector 36 is indicative of a maximum coupling condition in the depicted arrangement. Such an indication corresponds to the core 28 being centrally located over the major or fundamental-order-mode filament of the laser 10.

With the fiber 26 aligned as described above, a source 38 of ultraviolet radiation (FIG. 4) is positioned to direct its output in the direction of arrow 40 into the righthand end of the fiber 26. In a conventional way the ultraviolet output of the source 38 may be imaged onto the righthand end of the core 28 of the fiber or, alternatively, a diffuse ultraviolet source may simply be located near the righthand end of the fiber 26. In either case the relatively small-diameter core 28 serves as the principal transmission medium for propagating ultraviolet radiation from the source 38 to the righthand end face of the laser 10.

Figure 4:
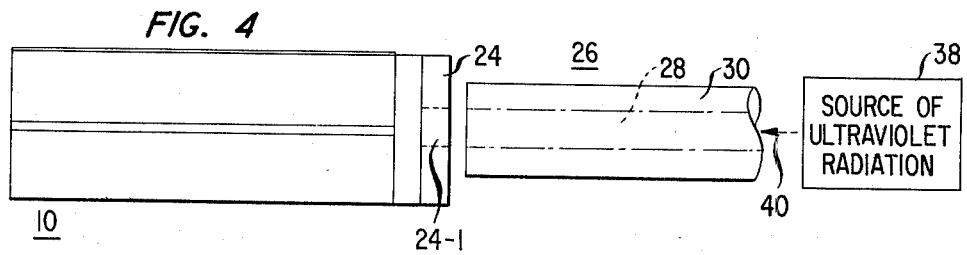

Some of the incident ultraviolet radiation provided by the source 38 of FIG. 4 may penetrate into the cladding 30 of the fiber 26. As described before above, a suitable coating (for example, glycerol) on the cladding will cause such penetrating radiation to be scattered out of the fiber 26 into the medium surrounding the fiber. As a result, the ultraviolet radiation that actually reaches the lefthand end of the fiber 26 is automatically confined to the core area and the immediate vicinity thereof.

In the manner described above, a particular portion of the positive photoresist layer 24 (FIG. 4) is exposed to ultraviolet radiation. Illustratively, the exposed portion of the photoresist has a generally circular cross-sectional area approximately 4 microns in diameter. The exposed portion, which is indicated by dashed lines and designated by reference numeral 24-1 in FIG. 4, is directly in line with the lefthand end of the core 28 of the fiber 26. And, because of the aforedescribed alignment procedure specified above in connection with FIG. 3, the exposed portion 24-1 corresponds spatially with the position of the fundamental-mode-output spot of the laser 10.

After exposure of the positive photoresist layer 24 (FIG. 4), the righthand end of the laser 10 is dipped into or otherwise treated in a conventional way with a standard micropositive developer. This is followed by a straightforward micropositive rinsing step. At that point the exposed and developed portion 24-1 has been removed from the layer 24 which, as illustrated in FIG. 5, leaves a circular opening therethrough.

Figure 5:
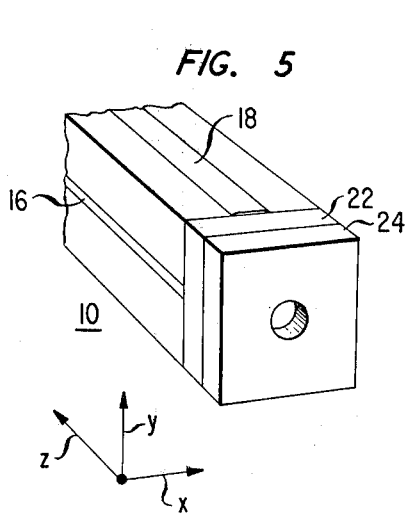

In accordance with the herein-described inventive method, the next step is to apply to the front end of the structure shown in FIG. 5 a film that exhibits high reflectance at the characteristic wavelength of the laser 10. Illustratively, a 0.5-micron-thick layer of aluminum is evaporated onto the depicted end to provide the desired high-reflectivity film.

A variety of metals are suitable for forming the specified high-reflectivity film on the end of the laser. Alternatively, standard multiple-layer dielectric films are available to form the desired high-reflectivity regions.

In any case the apertured photoresist layer 24 serves as a mask to allow only a very small accurately defined portion of the antireflective layer 22 to be coated with the high-reflectivity layer(s).

In some cases it is advantageous, before applying the high-reflectivity film to the end of the laser structure, to further clean the front surface of the layer 24 (FIG. 5) as well as the surface portion of the layer 22 that is in line with the opening in the layer 24. Such cleaning may be done, for example, by a conventional plasma etching step. This will typically improve the adhesion of the subsequently deposited high-reflectivity film to those surfaces.

Figure 6:
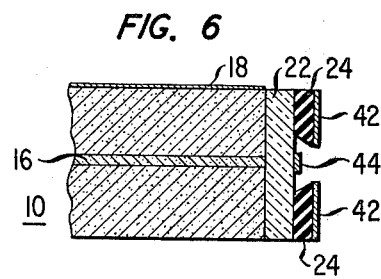

FIG. 6 is a side view of a cross-section formed by bisecting the FIG. 5 structure along a centrally located y–x plane. As shown in FIG. 6, the aforespecified high-reflectivity film comprises two portions. One portion, designated by reference numeral 42, is coated on the righthand surface of the photoresist 24. The other portion 44, applied through the aperture in the layer 24, is deposited directly on the antireflective layer 22.

Figure 7:
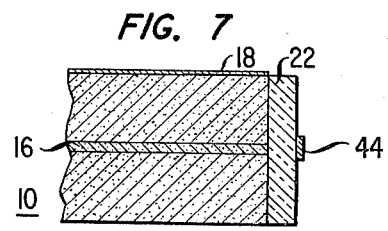

The next step in the inventive process is to remove the remaining portion of the photoresist from the laser 10. This is done, for example, by applying a conventional positive photoresist etchant to the righthand end of the structure of FIG. 6. In that way the photoresist layer 24 and the high-reflectivity portion 42 supported thereby are stripped away from the righthand end of the laser 10. At that point in the process, only the high-reflectivity portion 44 remains on the righthand end of the laser 10, as shown in FIG. 7.

Thus, in the manner described hereinabove, a very small high-reflectivity element (the portion 44 of FIG. 7) is fabricated on the antireflective layer 22. As specified above, this provides a small appropriately defined region of high-reflectivity surrounded by a region of low-reflectivity. Importantly, the element 44 is accurately aligned with respect to the active region 16 of the device 10 to optimize the conditions necessary for lasing to occur in only the fundamental mode. In this way, the unwanted phenomenon of filamentation in the depicted solid-state unit is effectively controlled.

Finally, it is to be understood that the above-described techniques are only illustrative of the application of the principles of the present invention. In accordance with those principles, numerous modifications thereof may be devised by those skilled in the art without departing from the spirit and scope of the invention. For example, if the righthand end face of the device 10 is initially formed to inherently exhibit a relatively low reflectivity, the specified antireflective layer 22 (FIG. 1) may not have to be coated on that face. In that case, the high-reflectivity region 44 (FIG. 7) fabricated in accordance with this invention is made of an electrically nonconductive material.

What is claimed is:

1. In a process for making a solid-state junction laser, a method for fabricating a small-area high-reflectivity region on one of the output faces of said laser to cause the laser to operate in only its fundamental mode, said method comprising the steps of depositing a positive photoresist layer on said one face, positioning one end of a single-mode optical fiber adjacent said one face to maximize optical power coupling between said laser and said fiber, said fiber comprising a core whose cross-sectional area is relatively small and a cladding disposed about said core, directing sensitizing radiation into other end of said fiber to propagate along the core of said fiber to expose the portion of said photoresist layer that is in line with the core of said fiber, the cross-sectional area of said exposed portion corresponding approximately to that of said core, removing the exposed portion of said photoresist layer thereby to provide an opening through said layer for access to a small-area portion of the one face of said laser, applying a high-reflectivity material to said remaining photoresist layer and through said opening onto said small-area portion of the one face of said laser, and removing the remaining photoresist layer along with the high-reflectivity material applied thereto thereby to leave high-reflectivity material only on said small-area portion.

2. A method as in claim 1 wherein said laser is a gallium arsenide double-heterostructure device and wherein said method further comprises the step of interposing an antireflective layer between said positive photoresist layer and said one face of said laser.

3. A method as in claim 2 further comprising the step of coating said fiber with a material to insure that propagation of radiation through said fiber is limited essentially to the core thereof.

4. A method as in claim 3 wherein said positioning step comprises moving the one end of said fiber relative to the one face of said laser by means of a microposi-tioner.

5. A method as in claim 4 wherein said positioning step further includes placing a photodetector near the other end of said fiber to indicate the amount of optical power coupled from said laser to said fiber.

6. A method as in claim 5 wherein said positive photoresist layer comprises a 1.5-micron-thick layer, wherein the cross-sectional area of said core is approximately 4 microns and that of said cladding is approximately 250 microns, wherein said sensitizing radiation is provided by a source of ultraviolet radiation positioned near the other end of said fiber, wherein said first-mentioned photoresist removal step comprises developing and rinsing said photoresist, wherein said second-mentioned photoresist removal step comprises etching said photoresist, wherein said high-reflectivity material comprises a 0.5-micron-thick film of aluminum, wherein said antireflective layer comprises a 0.1-micron-thick layer of $ZrO_2$, and wherein said fiber-coating material comprises glycerol.

7. In a process for making a stripe-geometry solid-state laser, a method for fabricating a very small self-aligned mirror on one of the output faces of said laser to control filamentation, said method comprising the steps of depositing antireflective and positive photoresist layers in that order on said one face of said laser, moving one end of a single-mode cladded-core optical fiber adjacent said one face to a position to maximize optical-power coupling between said laser and said fiber, directing radiant energy into the other end of said fiber to propagate along the core thereof to irradiate a portion of said photoresist whose area approximates that of said core, removing said irradiated portion of photoresist to provide an opening in said photoresist layer to expose a corresponding portion of the underlying antireflective layer, depositing a high-reflectivity layer on the remaining portions of said photoresist and on said corresponding portion of the antireflective layer, and removing the high-reflectivity-layered remaining portions of said photoresist thereby to leave on said laser face an antireflective layer having thereon an accurately positioned high-reflectivity portion whose area approximates that of said fiber core.

* * * * *